United States Patent
Sharpe-Geisler

[19]

[11] Patent Number: 6,124,733
[45] Date of Patent: Sep. 26, 2000

[54] INPUT BUFFER PROVIDING VIRTUAL HYSTERESIS

[75] Inventor: Bradley A. Sharpe-Geisler, San Jose, Calif.

[73] Assignee: Advanced Micro Devices, Inc., Sunnyvale, Calif.

[21] Appl. No.: 08/996,442

[22] Filed: Dec. 22, 1997

[51] Int. Cl.[7] .................. H03K 19/003; H03K 19/0175; H03K 3/037; H03B 1/00
[52] U.S. Cl. ................................ 326/83; 326/83; 326/87; 326/86; 326/31; 326/34; 326/33; 326/24; 327/108; 327/112; 327/262; 327/205; 327/206
[58] Field of Search .................................. 326/31, 33, 34, 326/83, 87, 86, 24; 327/108, 112, 262, 205, 206

[56] References Cited

U.S. PATENT DOCUMENTS

| | | | |
|---|---|---|---|
| 4,506,168 | 3/1985 | Uya | 327/206 |
| 4,539,489 | 9/1985 | Vaughn | 327/206 |
| 5,023,472 | 6/1991 | Hashimoto et al. | 327/108 |
| 5,198,699 | 3/1993 | Hashimoto et al. | 327/108 |
| 5,349,246 | 9/1994 | McClure | 326/22 |
| 5,459,437 | 10/1995 | Campbell | 331/111 |
| 5,559,461 | 9/1996 | Yamashina et al. | 327/205 |
| 5,594,361 | 1/1997 | Campbell | 326/24 |
| 5,654,981 | 8/1997 | Mahant-Shetti et al. | 375/219 |
| 5,668,488 | 9/1997 | Sharpe-Geisler et al. | 327/108 |
| 5,676,728 | 10/1997 | Cudos | 71/26 |
| 5,760,620 | 6/1998 | Doluca | 327/112 |

*Primary Examiner*—Michael Tokar
*Assistant Examiner*—Vibol Tan
*Attorney, Agent, or Firm*—Fliesler, Dubb, Meyer & Lovejoy

[57] ABSTRACT

An input buffer includes a first CMOS inverter (400) made up of a PMOS transistor (602) connecting Vdd to the buffer output and an NMOS transistor (604) connecting the buffer output to Vss. NMOS transistors (404) and (414) have with series connected source to drain paths to connect the buffer output to Vss in conjunction with transistor (604) of inverter (400). PMOS transistors (402) and (412) have series connected source to drain paths connecting Vdd to the buffer output in conjunction with transistor (602). To control transistors (402, 404, 412 and 414) an inverter (420) is connected from the buffer output to the gates of transistors (402 and 404), and inverters (431, 432, 433, and 440) are connected between the buffer input and the gates of transistors (412 and 414). After a low to high buffer input transition above a level (H1), the inverter (420) will transition and the NMOS transistors (404 and 414) will turn on together to create a path to Vss with transistor (604) of inverter (400) to decrease the buffer threshold to (H2). After the buffer input rises further above a threshold (H1A) of inverter (431) combined with inverter (440), inverter (433) will turn off transistor (414) to set the buffer threshold back to (H1). After a high to low buffer input transition below a level (H1), the inverter (420) will transition and the PMOS transistors (402 and 412) will both be on together to create a path to Vdd with transistor (602) of inverter (400) to increase the buffer threshold to (H3). After the buffer input falls further below a threshold (H1B) of inverters (431) and (440), inverter (433) will turn off transistor (412) to set the buffer threshold back to (H1).

12 Claims, 5 Drawing Sheets

INPUT BUFFER PROVIDING VIRTUAL HYSTERESIS

BACKGROUND OF THE INVENTION

1. Field of the Invention

The present invention relates to an input buffer using components providing hysteresis to prevent the buffer output from inadvertently transitioning due to input signal noise.

2. Description of the Related Art

Noise in a circuit can cause ringing during a signal transition as illustrated in FIG. 1. If an input buffer has a fixed threshold voltage of H1, when ringing occurs the output of such an input buffer will transition on the first edge of the signal, and then transition two more times during the ringing before the second edge of the signal is reached and the signal becomes stable. A transition only on the first edge is desired.

A Schmitt trigger as shown in FIG. 2 can be used as an input buffer to prevent buffer transitioning during ringing of an input signal. To prevent transitions during ringing, the Schmitt trigger has a variable input threshold providing hysteresis. As illustrated in FIG. 3, with an input signal transitioning low to high, the Schmitt trigger has a first threshold higher than H1 prior to the Schmitt trigger output transition because the NMOS transistor 100 is on and the PMOS transistor 102 is off. However, immediately after a transition of the output of the Schmitt trigger, the buffer threshold shifts to a value lower than H1 because the NMOS transistor 100 turns off and the PMOS transistor 102 turns on. With the immediate shift to a lower threshold, signal ringing during a transition will not cause the output of the Schmitt trigger to inadvertently transition. Similarly on a high to low transition of an input signal, the Schmitt trigger has a threshold which changes from being lower than H1 to higher than H1 immediately after a transition of the Schmitt trigger output so that ringing will not cause an undesired buffer output transition.

A decrease in circuit operation speed, however, occurs when a Schmitt trigger is used, as opposed to a buffer which has a fixed threshold of H1. As illustrated in FIG. 3, on a low to high transition of an input signal, the Schmitt trigger threshold will be slightly higher than H1. The Schmitt trigger will, thus, take slightly longer to provide an output transition on a low to high input signal transition than a buffer having a threshold fixed at H1. Similarly, on a high to low transition of an input signal, the Schmitt trigger threshold will be slightly lower than H1. The Schmitt trigger will then again take slightly longer to provide an output signal transition on a high to low input signal transition than a buffer having a threshold fixed at H1.

SUMMARY OF THE INVENTION

The present invention provides an input buffer which provides hysteresis to prevent erroneous output signal transitions due to input signal noise.

The buffer of the present invention further provides faster operation speed than a Schmitt trigger.

The present invention is an input buffer including a first CMOS inverter with a first PMOS transistor connecting Vdd to the buffer output and a first NMOS transistor connecting the buffer output to Vss.

To decrease the buffer threshold for a time after a low to high transition of the buffer input, second and third NMOS transistors are provided with source to drain paths connecting the buffer output to Vss in conjunction with the first NMOS transistor of the CMOS inverter. To increase the buffer threshold for a time after a high to low transition of the buffer input, second and third PMOS transistors are provided with source to drain paths connecting Vdd to the buffer output in conjunction with the first PMOS transistor.

To control when transistors are turned on together to raise or lower the buffer threshold, a second inverter is connected from the buffer output to the gates of the second PMOS and NMOS transistors. Further, a third inverter, a latch, and a fourth inverter are connected from the buffer input to the gates of the third PMOS and NMOS transistors.

As connected, when the buffer input signal is low, the third NMOS transistor will be on, but the second NMOS transistor will be off to cut off a path to Vss, Further, the second PMOS transistor will be on, but the third PMOS transistor will be off to cut off a path to Vdd. The PMOS and NMOS transistors of the first inverter will, thus, act alone to set the threshold of the buffer to a level (H1).

After the buffer input transitions from low to high through a threshold (H1), the second inverter will change states causing the second NMOS and PMOS transistors to change states prior to the third NMOS and PMOS transistors. The second and third NMOS transistors will then both be on together to create a path to Vss in conjunction with the first NMOS transistor of the first inverter to decrease the buffer threshold to (H2) below (H1).

With the buffer input initially low before the low to high transition, the third inverter and the latch will have PMOS transistors turned on together to provide an effective threshold above (H1) at a level (H1A). Once the buffer input further transitions toward high reaching the level (H1A), the third inverter, latch, and fourth inverter will change states, so the third NMOS transistor will turn off to cut off a path to Vss. The PMOS and NMOS transistors of the first inverter will then again act alone to set the buffer threshold back to (H1).

After the buffer input later transitions from high to low through a threshold (H1), the second inverter will change states causing the second NMOS and PMOS transistors to again change states prior to the third NMOS and PMOS transistors. The second and third PMOS transistors will then both be on together to create a path to Vdd in conjunction with the first PMOS transistor of the first inverter to increase the buffer threshold to (H3).

With the buffer input initially high before the high to low transition, the third inverter and the latch will have NMOS transistors turned on together to provide an effective threshold below (H1) at a level (H1B). Once the buffer input further transitions toward low reaching the level (H1B), the second inverter, latch, and third inverter will change states, so the third PMOS transistor will turn off to cut off a path to Vdd. The PMOS and NMOS transistors of the first inverter will then again act alone to set the buffer threshold back to (H1).

With the buffer of the present invention having a threshold changing from (H1) for a time after a buffer input signal transitions, hysteresis is provided so that ringing as illustrated in FIG. 1 will not inadvertently cause a transition in the buffer output. Further, with the threshold of the buffer changing back to (H1) after the buffer input signal further transitions, the buffer of the present invention will operate faster than a Schmitt trigger on a subsequent buffer input transition.

BRIEF DESCRIPTION OF THE DRAWINGS

Further details of the present invention are explained with the help of the attached drawings in which.

DETAILED DESCRIPTION

Figure 4:
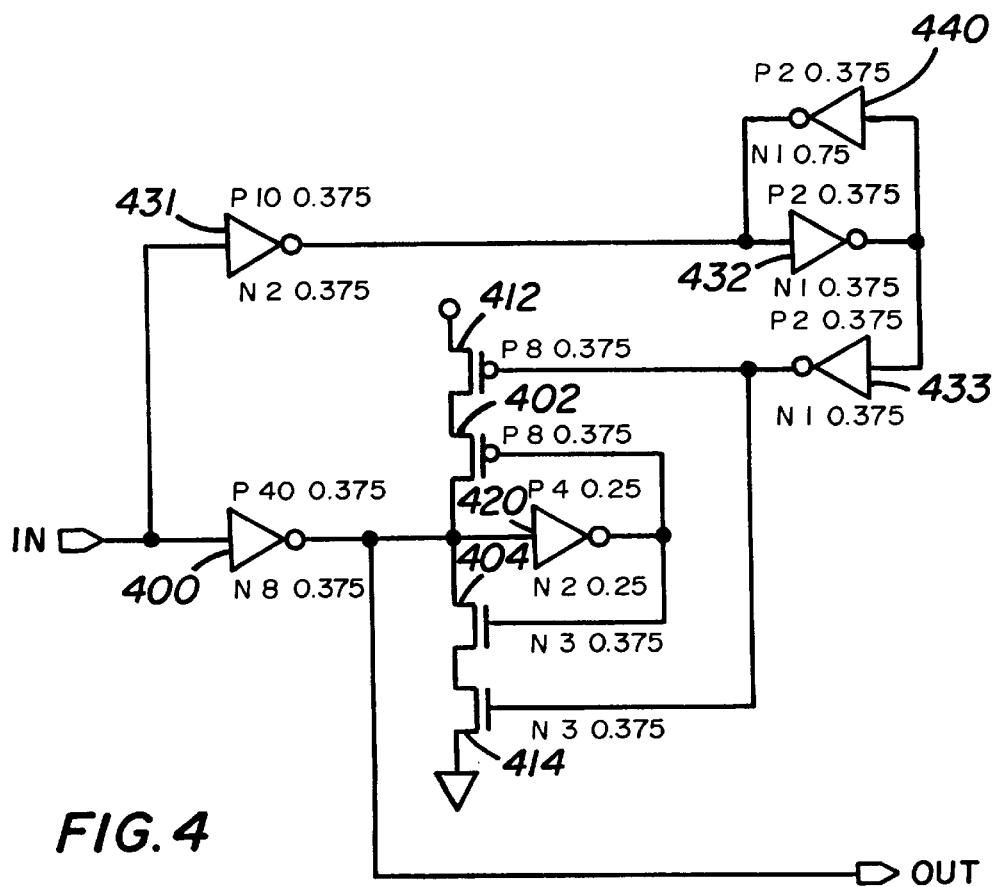
FIG. 4 shows circuitry for a virtual hysteresis input buffer of the present invention.

FIG. 4 shows circuitry for a virtual hysteresis input buffer of the present invention. The circuit receives an input signal (IN) and provides an output signal (OUT). In FIG. 4, sizes of components are shown with transistor type followed by channel width and channel length. For inverters in FIG. 4, PMOS transistor size is shown above the inverter symbol, while NMOS transistor size is shown below the inverter symbol.

Figure 5:
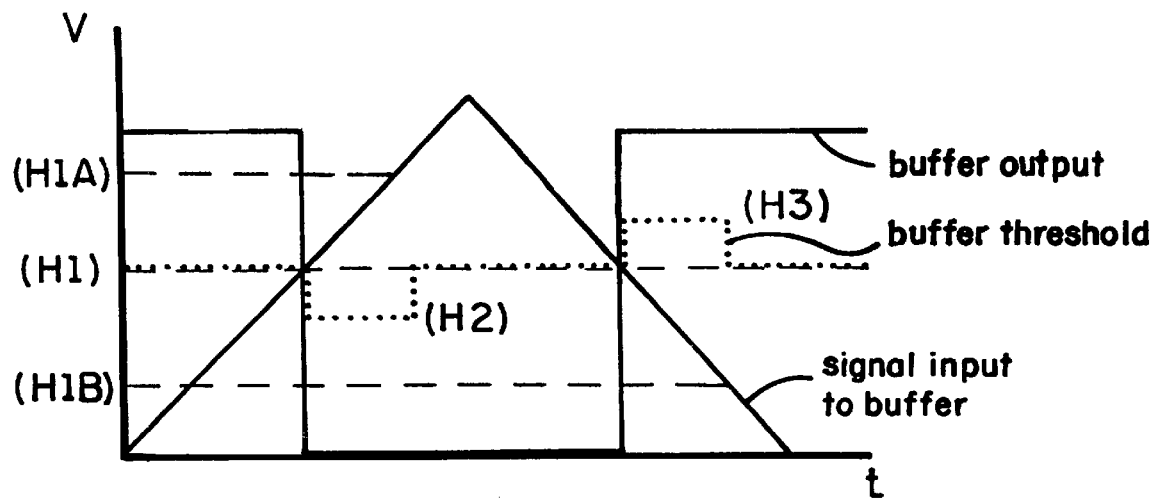
FIG. 5 further illustrates an output signal from the circuitry of FIG. 4 in response to an input signal, along with the change in threshold for the circuit of FIG. 4.

FIG. 5 illustrates an output signal (OUT) from the circuitry of FIG. 4 in response to an input signal (IN), along with the change in threshold for the circuit of FIG. 4. For discussion of the function of FIG. 4, reference will be made to FIG. 5.

Figure 6:
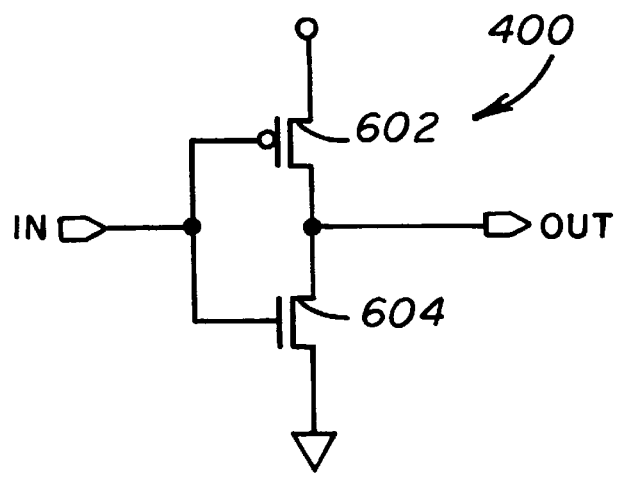
FIG. 6 shows circuitry for the inverter 400 of FIG. 4.

The circuit of FIG. 4 includes an inverter 400. The inverter 400 is a CMOS device with components as shown in FIG. 6. The inverter 400 acting alone has a nominal threshold of H1 illustrated in FIG. 5. As shown in FIG. 6, the inverter 400 includes a PMOS pull up transistor 602 having a source connected to Vdd, a drain connected to the inverter output and a gate connected to the inverter input. The inverter 400 further includes an NMOS transistor 604 having a drain connected to the buffer output, a source connected to Vss, and a gate connected to the inverter input. A ratio of the channel width of transistor 602 to the channel width of transistor 604 determines the threshold of inverter 400. In FIGS. 4 and 6, PMOS transistors, such as 602, will be shown with a gate circle, while NMOS transistors, such as 604, will be shown without a gate circle.

The buffer of FIG. 4 further includes two NMOS transistors 404 and 414 to act in conjunction with the NMOS transistor 604 of inverter 400 to alter the threshold of the buffer of FIG. 4 after a low to high transition of the input signal IN. With transistors 604, 404, and 414 acting together, the ratio of the combined size of transistors 604, 404, and 414 to the size of transistor 602 will act so that the overall buffer threshold is reduced from H1 to a level H2, as illustrated in FIG. 5.

The buffer of FIG. 4 also includes two PMOS pull up transistors 402 and 412 to act in conjunction with the PMOS pull up transistor 602 to alter the threshold of the buffer of FIG. 4 after a high to low transition of the input signal. With transistors 602, 402 and 412 acting together, the ratio of the combined size of transistors 602, 402 and 412 to the size of transistor 604 will cause the buffer threshold to increase from H1 to a level H3, as illustrated in FIG. 5.

To control when transistors 402 and 404 turn on, the circuit of FIG. 4 further includes PMOS transistor 412, NMOS transistor 414, inverter 420, an inverter 431, a latch made of inverters 432 and 440, and inverter 433. NMOS transistor 414 has a source to drain path connected in series with the source to drain path of NMOS transistor 404 to connect the buffer output to Vss. PMOS transistor 412 has a source to drain path connected in series with the source to drain path of transistor 402 to connect Vdd to the buffer output. Inverter 420 connects the buffer output to the gates of transistors 402 and 404. Inverter 431, latch 432,440, and inverter 433 are connected in series to connect the buffer input to the gates of transistors 412 and 414.

In operation, the input signal IN is first assumed to be low. With IN low, the output of inverter 400 and the output OUT of the buffer will be high. With the output of inverter 400 high, inverter 420 will provide a low to turn on PMOS transistor 402 and turn off NMOS transistor 404. With IN low, the output of inverter 433 will be high, the output of latch 432,440 will be low, and the output of inverter 433 will be high to turn on NMOS transistor 414 and turn off PMOS transistor 412. With PMOS transistor 412 off, no path to Vdd will be provided through PMOS transistors 402 and 412, so PMOS transistor 402 will not act in combination with PMOS transistor 602 of inverter 400 to decrease the threshold of the buffer. Further, with transistor 404 off, no path will be provided through NMOS transistors 404 and 414 to Vss, so NMOS transistor 404 will not act in combination with the NMOS transistor 604 of inverter 400 to increase the threshold of the buffer of FIG. 4. Thus, the buffer of FIG. 4 will have a threshold equal to that of inverter 400, or H1 as illustrated in FIG. 5.

With IN low, the PMOS transistors of both inverters 431 and 440 will be on together. With the PMOS transistors of inverters 431 and 440 both acting together, the effective threshold at the input to inverter 431 will be determined by the width of both PMOS transistors 431 and 440 with respect to the width of the NMOS transistor of inverter 431. With the size of transistors of inverter 431 being proportional to the size of transistors of inverter 400, and PMOS transistors of inverters 440 and 431 acting together, the threshold at the input of inverter 431 will be higher than H1, or at a level H1A shown in FIG. 5.

The input signal IN is next assumed to transition from low toward high through a level H1. With IN transitioning through H1, the output of inverter 400 and the buffer output (OUT) will transition from high to low. With the output of inverter 400 going low, the inverter 420 output will transition to high after a short time to turn on NMOS transistor 404 and turn off PMOS transistor 402. With the buffer input signal below H1A, the inverter 431 will not yet transition. NMOS transistors 404 and 414 will, thus, both be on together in combination with NMOS transistor 604 to reduce the buffer threshold from a level H1 to a level H2, as illustrated in FIG. 5.

The input signal IN is next assumed to complete transition from low to high through the level H1A. With IN transitioning through H1A, inverter 431 will transition along with latch 432,440 and inverter 433 so that the output of inverter 433 will go low. With the output of inverter 433 going low, NMOS transistor 414 will turn off and PMOS transistor 412 will turn on. With NMOS transistor 404 being on and NMOS transistor 414 being off, the path through transistors 404 and 414 to Vss will be turned off. With PMOS transistor 402 remaining off, no path will be provided through transistors 402 and 412 to Vdd. The transistors of inverter 400 will then drive the buffer output OUT alone, and the threshold of the circuit of FIG. 4 will return to a level H1 as shown in FIG. 5.

With IN being high, the NMOS transistors of both inverters 431 and 440 will be on together. With the NMOS transistors of inverters 431 and 440 acting together, the effective threshold at the input of inverter 431 will be determined by the width of the NMOS transistors of inverters 431 and 440 with respect to the width of the PMOS transistor of inverter 431. The effective threshold at the input of inverter 431 will, thus, decrease from a level H1A when the buffer input was low to a level H1B as illustrated in FIG. 5.

The input signal IN is next assumed to transition from high toward low through a level H1. With IN transitioning through H1, the output of inverter 400 and the buffer output OUT will transition from low to high. With the output of inverter 400 going high, the inverter 420 output will transition to low after a short time to turn on transistor 402 and turn off transistor 404. With the buffer input signal above H1B, the inverter 431 will not yet transition. PMOS transistors 402 and 412 will, thus, both be on together in combination with PMOS transistor 602 to increase the buffer threshold from a level H1 to a level H3, as illustrated in FIG. 5.

The input signal IN is next assumed to complete transition from high to low through the level H1B. With IN transitioning through H1B, inverter 431 will transition along with latch 432,440 and inverter 433 so that the output of inverter 433 will go high. With the output of inverter 433 going high, PMOS transistor 412 will turn off and NMOS transistor 414 will turn on. With PMOS transistor 402 being on and PMOS transistor 412 being off, the path through transistors 402 and 412 to Vdd will be turned off. With NMOS transistor 404 remaining off, no path will be provided through transistors 404 and 414 to Vss. The transistors of inverter 400 will then drive the buffer output OUT alone, and the threshold of the circuit of FIG. 4 will return to a level H1, as shown in FIG. 5.

Figure 1:
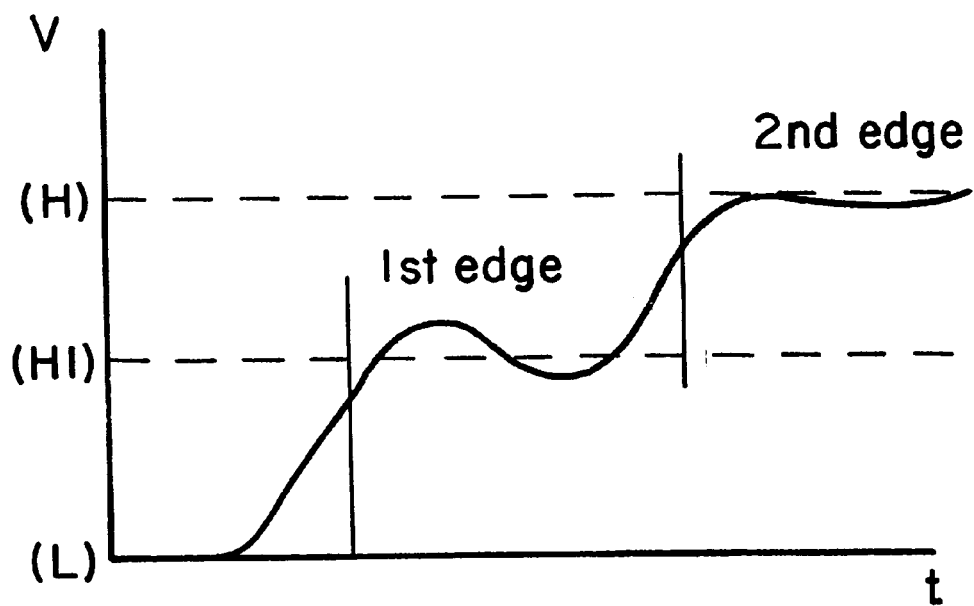
FIG. 1 illustrates ringing in a signal which is provided to an input buffer.

With the circuit of FIG. 4 operating as described, when an input signal is provided transitioning from low to high as shown in FIG. 1, the threshold of the buffer will change from H1 to a value H2 lower than H1 after the buffer input rises above H1. The buffer output, therefore, will not inadvertently transition back during ringing of the input signal between H1 and H2. Further, the buffer threshold H2 will not change during ringing of the buffer input signal between H1 and H1A. Once the buffer input signal transition to high is complete, the buffer input signal will be above H1A, and the buffer threshold will return back to H1 for a subsequent high to low signal transition.

Although shown with an inverter 440, the circuit of FIG. 4 can operate without inverter 440 if the delay through inverters 431–433 is greater than the delay through inverters 400 and 420. With such a configuration, after a low to high transition, transistors 404 and 414 will be turned on together to lower the buffer threshold to H2 for a period of time between when inverter 420 transitions and inverter 433 later transitions. Further, during a high to low transition, transistors 402 and 412 will be turned on together for a period of time between when inverter 420 transitions and when inverter 433 later transitions.

Although the embodiment without inverter 440 provides hysteresis, an embodiment is preferred with inverter 440 when ringing of an input signal around H1 occurs for a longer period than the delay difference between inverters 400–420, and inverters 431–433. With inverter 440 included, ringing can continue after inverter 400 transitions without an inadvertent output transition as long as the threshold of the combination of inverters 431 and 440 is not reached.

Figure 2:
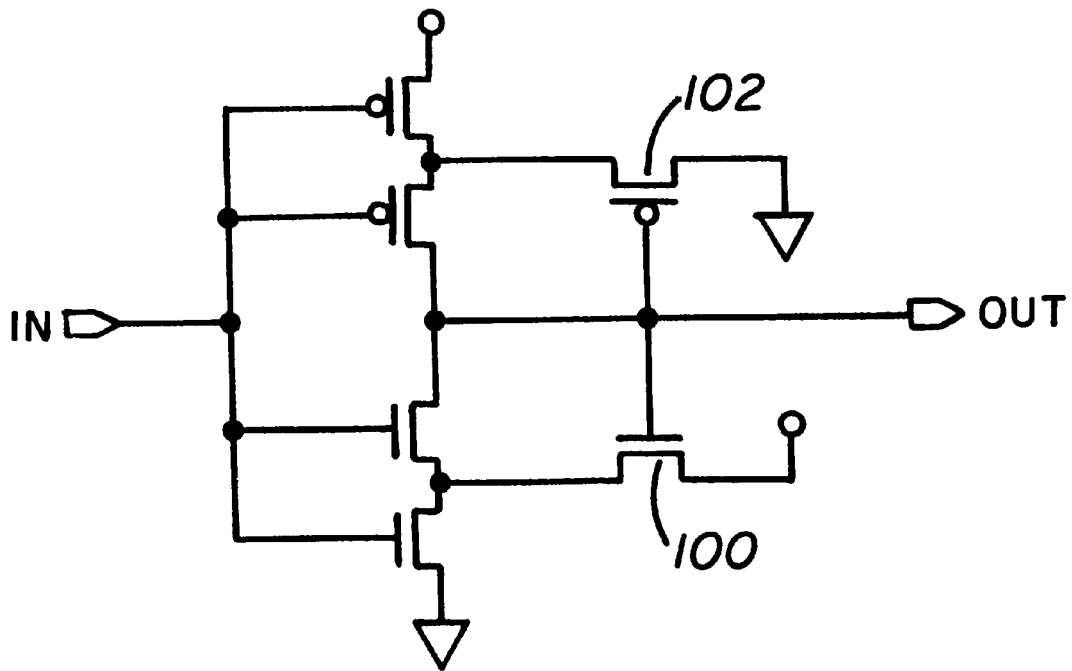
FIG. 2 shows circuitry for a Schmitt trigger.
Figure 3:
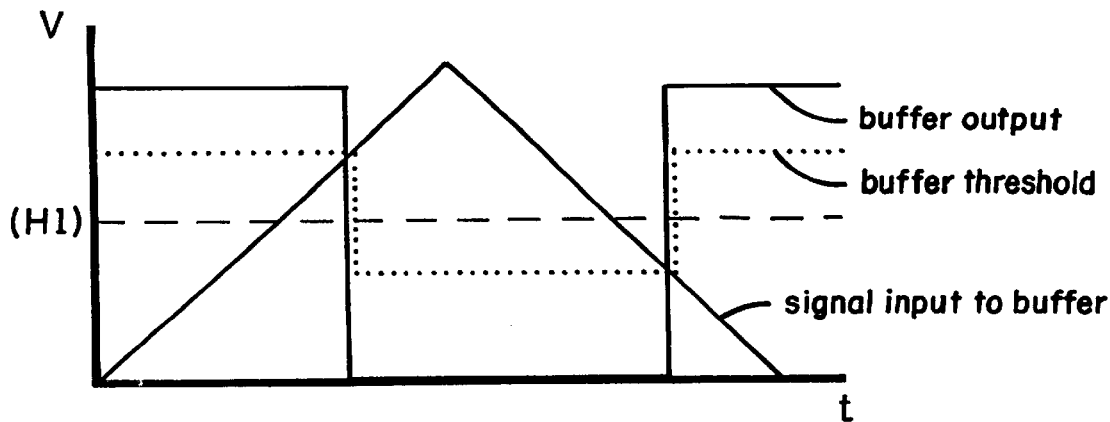
FIG. 3 shows a Schmitt trigger output in response to an input signal, along with the change in threshold for the Schmitt trigger.
Figure 7:
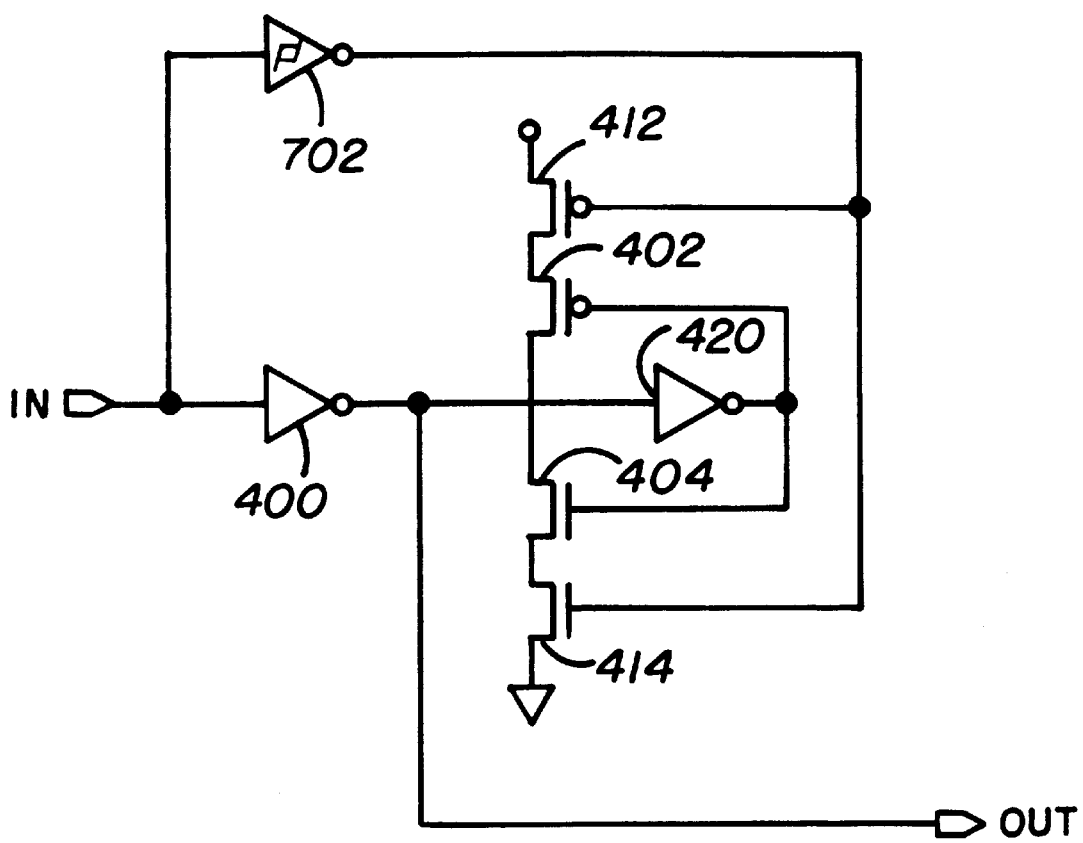
FIG. 7 shows another embodiment of a virtual hysteresis input buffer of the present invention.

FIG. 7 shows another embodiment of a virtual hysteresis input buffer of the present invention. This embodiment can be provided by replacing the inverters 431–433 and 440 of FIG. 4 with a Schmitt trigger 702, such as the Schmitt trigger shown in FIG. 2. The Schmitt trigger will connect the buffer input to the gates of transistors 412 and 414. The Schmitt trigger functions with the remaining circuitry of FIG. 4 in the same manner as inverters 431–433 and 440 acting together, as described previously.

Figure 8:
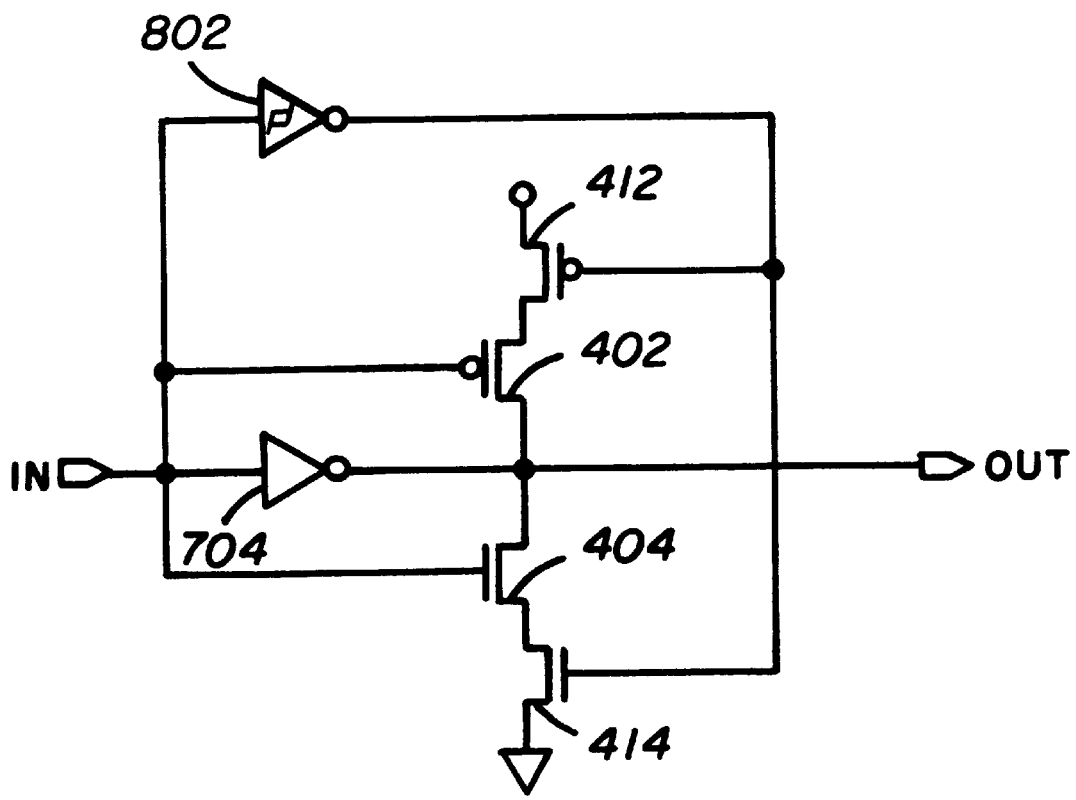
FIG. 8 shows another embodiment of a virtual hysteresis input buffer of the present invention.

FIG. 8 shows another embodiment of a virtual hysteresis input buffer of the present invention. The circuitry includes PMOS transistors 402 and 412 connecting vdd to the buffer output and NMOS transistors 404 and 414 connecting the buffer output to Vss, similar to the circuit of FIG. 4. Further, a Schmitt trigger 802 connects the buffer input to the gates of transistors 412 and 414, similar to the embodiment described above. Instead of using two inverters 400 and 420, as in FIG. 4, one inverter 704 is used in FIG. 8. The one inverter 704 has an input providing the buffer input and an output providing the buffer output, similar to inverter 400. The function of inverter 420 in FIG. 8 is provided by connecting the buffer input to the gates of transistors 402 and 404. The circuit of FIG. 4 will, then, function in a manner similar to the circuit of FIG. 4, as described previously.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A buffer comprising:
    a first inverter having an input providing the buffer input and an output providing the buffer output, the first inverter comprising:
        a first PMOS transistor having a source to drain path coupling Vdd to the buffer output and a gate coupled to the buffer input; and
        a first NMOS transistor having a source to drain path coupling the buffer output to Vss and a gate coupled to the buffer input;
    a second PMOS transistor;
    a second NMOS transistor; and
    a threshold altering means coupled to the buffer input, the buffer output and to the second PMOS and NMOS transistors, the threshold altering means enabling the source to drain path of the second NMOS transistor to provide Vss to the buffer output for a first time period after the buffer input transitions from low to high, the first time period beginning after the buffer output transitions in response to the low to high buffer input transition and potentially ending before the input transitions from high back to low, the threshold altering means preventing the source to drain path of the second NMOS transistor from providing Vss to the buffer output before and after the first time period, the threshold altering means further enabling the source to drain path of the second PMOS transistor to provide Vdd to the buffer output for a second time period after the buffer input transitions from high to low, the second time period beginning after the buffer output transitions in response to the high to low buffer input transition and potentially ending before the buffer input transitions from low back to high, the threshold altering means preventing the source to drain path of the second PMOS transistor from providing Vdd to the buffer output before and after the second time period.

2. The buffer of claim 1, wherein a threshold of the first inverter has a first value (H1), and wherein the first time period is a time required for the buffer input to transition substantially from (H1) to a value (H1A) which is between (H1) and a value for high, and wherein the second time period is a time required for the buffer input to transition substantially from (H1) to a value (H1B) which is between (H1) and a value for low.

3. The buffer of claim 2, wherein the threshold altering means comprises:

a third PMOS transistor having a source to drain path coupling the source to drain path of the second PMOS transistor to Vdd, and having a gate;

a third NMOS transistor having a source to drain path coupling the source to drain path of the second NMOS transistor to Vss, and having a gate;

a second inverter coupling the output of the first inverter to a gate of the second PMOS transistor and to a gate of the second NMOS transistor;

a third inverter having an input coupled to the buffer input, and having an output;

a latch having a first terminal coupled to the output of the third inverter and having a second terminal; and a fourth inverter having an input coupled to the second terminal of the latch, and having an output coupled to the gate of the third PMOS transistor and to the gate of the third NMOS transistor.

4. The buffer of claim 3, wherein the latch comprises:

a fifth inverter having an input forming the first terminal of the latch and an output forming the second terminal of the latch; and a sixth inverter having an input coupled to the output of the fifth inverter, and an output coupled to the input of the fifth inverter.

5. The buffer of claim 1, wherein the threshold altering means comprises:

a third PMOS transistor having a source to drain path coupling the source to drain path of the second PMOS transistor to Vdd, and having a gate;

a third NMOS transistor having a source to drain path coupling the source to drain path of the second NMOS transistor to Vss, and having a gate;

a second inverter coupling the output of the first inverter to a gate of the second PMOS transistor and to a gate of the second NMOS transistor, and three series inverters coupling the buffer input to a gate of the third PMOS transistor and to the gate of the third NMOS transistor.

6. The buffer of claim 5, wherein the first time period and second time period are substantially a difference between the delay through the first and second inverters and a delay through the three series inverters.

7. The buffer of claim 1, wherein the threshold altering means comprises:

a third PMOS transistor having a source to drain path coupling the source to drain path of the second PMOS transistor to Vdd, and having a gate;

a third NMOS transistor having a source to drain path coupling the source to drain path of the second NMOS transistor to Vss, and having a gate;

a second inverter coupling the output of the first inverter to a gate of the second PMOS transistor and to a gate of the second NMOS transistor;

a Schmitt trigger coupling the buffer input to the gate of the third PMOS transistor and to the gate of the third NMOS transistor.

8. The buffer of claim 1, wherein gates of the second NMOS transistor and the second PMOS transistor are coupled to the buffer input, and wherein the threshold altering means comprises:

a third PMOS transistor having a source to drain path coupling the source to drain path of the second PMOS transistor to Vdd, and having a gate;

a third NMOS transistor having a source to drain path coupling the source to drain path of the second NMOS transistor to Vss, and having a gate; and a Schmitt trigger coupling the buffer input to the gate of the third PMOS transistor and to the gate of the third NMOS transistor.

9. A buffer comprising:

a first CMOS inverter having an input providing the buffer input and an output providing the buffer output;

a first PMOS transistor having a source coupled to Vdd, a drain and a gate;

a second PMOS transistor having a source coupled to the drain of the first PMOS transistor, a drain coupled to the buffer output, and having a gate;

a first NMOS transistor having a drain coupled to the buffer output, a source and a gate;

a second NMOS transistor having a drain coupled to the source of the first NMOS transistor, a source coupled to Vss, and having a gate;

a second inverter coupling the output of the first inverter to the gate of the first PMOS transistor and to the gate of the first NMOS transistor, and third, fourth, and fifth series inverters coupling the buffer input to the gate of the second PMOS transistor and to the gate of the second NMOS transistor.

10. The buffer of claim 9 further comprising:

a sixth inverter having an input coupled to an output of the fourth inverter, and an output coupled to an input of the fourth inverter.

11. A buffer comprising:

a first CMOS inverter having an input providing the buffer input and an output providing the buffer output;

a first PMOS transistor having a source coupled to Vdd, gate coupled to the buffer input, and having a drain;

a second PMOS transistor having a source coupled to the drain of the first PMOS transistor, a drain coupled to the buffer output, and having a gate;

a first NMOS transistor having a drain coupled to the buffer output, a gate coupled to the buffer input, and having a source;

a second NMOS transistor having a drain coupled to the source of the first NMOS transistor, a source coupled to Vss, and having a gate;

a Schmitt trigger coupling the buffer input to the gates of the second PMOS transistor and the second NMOS transistor.

12. The buffer of claim 11, wherein the gates of the first PMOS transistor and the first NMOS transistor are coupled to the buffer input through the first CMOS inverter and a second inverter connected in series.

* * * * *